United States Patent [19]  
Steppan et al.

[11] 4,021,243  
[45] May 3, 1977

[54] DIAZO LIGHT-SENSITIVE COPYING COMPOSITION AND PROCESS OF USING IN THE MANUFACTURE OF SCREEN PRINTING STENCILS

[75] Inventors: Hartmut Steppan, Wiesbaden-Dotzheim; Hans Ruckert, Wiesbaden-Schierstein, both of Germany

[73] Assignee: Hoechst Aktiengesellschaft, Germany

[22] Filed: Jan. 22, 1976

[21] Appl. No.: 651,317

Related U.S. Application Data

[63] Continuation of Ser. No. 172,886, Aug. 18, 1971, abandoned.

[30] Foreign Application Priority Data

Aug. 20, 1970 Germany .................... 2041395

[52] U.S. Cl. .................... 96/36.4; 96/75; 96/91 R; 260/142
[51] Int. Cl.$^2$ .................... G03F 7/12; G03F 7/08
[58] Field of Search .................... 96/36.4, 75, 91 R

[56] References Cited

UNITED STATES PATENTS

| | | | |
|---|---|---|---|
| 3,235,382 | 2/1966 | Neugebauer et al. | 96/75 |
| 3,246,986 | 4/1966 | Borchers | 96/75 |
| 3,390,993 | 7/1968 | Borchers | 96/75 |
| 3,679,419 | 7/1972 | Gillich | 96/91 R |
| 3,849,392 | 11/1974 | Steppan | 96/49 |
| 3,867,147 | 2/1975 | Teuscher | 96/91 R |

*Primary Examiner*—Charles L. Bowers, Jr.  
*Attorney, Agent, or Firm*—James E. Bryan

[57] ABSTRACT

This invention relates to a light-sensitive copying composition for the preparation of screen printing stencils comprising a condensation product of an aromatic diazonium compound in admixture with a hydrophilic hardenable binder, the condensation product containing at least one unit each of the general types $A(-D)_n$ and B which are connected by bivalent intermediate members derived from a condensable carbonyl compound, wherein A is a radical of a compound containing at least two isocyclic or heterocyclic aromatic nuclei, which compound is capable of condensation in at least one position with an active carbonyl compound in an acid medium, D is a diazonium salt group attached to an aromatic carbon atom of A, $n$ is an integer from 1 to 10, and B is a radical of a compound free of diazonium groups, which compound is capable of condensation in at least one position with an active carbonyl compound in an acid medium, and wherein the anion of the diazonium salt is derived from an aliphatic monosulfonic acid having 1 to 6 carbon atoms.

27 Claims, No Drawings

DIAZO LIGHT-SENSITIVE COPYING COMPOSITION AND PROCESS OF USING IN THE MANUFACTURE OF SCREEN PRINTING STENCILS

This is a continuation of application Ser. No. 172,886, filed Aug. 18, 1971, now abandoned.

The present invention is concerned with a light-sensitive copying composition for use in the manufacture of screen printing stencils, which contains a condensation product of an aromatic diazonium compound in admixture with a hydrophilic hardenable binder.

It is already known, e.g. from published German Patent Specification (DAS) No. 1,289,741, to use condensation products of aromatic diazonium compounds, e.g. diphenyl amines, and aldehydes for screen printing. Further, it is known that monomeric diazo compounds, e.g. diazo diphenyl amines, when combined with aldehydes, yield layers which are particularly suitable for screen printing and which also become cross-linked upon exposure (see German Patent Specification No. 1,206,308).

In copending applications Ser. Nos. 826,297 and 826,296, both filed May 20, 1969, both now abandoned, former refiled as continuation, Ser. No. 410,324, filed Oct. 29, 1973, now U.S. Pat. No. 3,867,147, latter refiled as continuation, Ser. No. 224,324, Feb. 7, 1972, now U.S. Pat. No. 3,849,392, it has been suggested, inter alia, to produce screen printing layers containing hardenable binders and mixed condensation products obtained from aromatic diazonium compounds, condensable compounds, and active carbonyl compounds. The condensation products are used in the form of their water-soluble salts, e.g. the chlorides. In these earlier patent applications, mention is also made generally of the salts of the condensation products with aliphatic sulfonic acids as light-sensitive substances, without stating the particular properties of these compounds or their suitability for a special purpose.

The present invention provides a light-sensitive copying composition for the manufacture of screen printing stencils, which possesses a high light-sensitivity and good storability, and yields copying layers which are capable of being developed with aqueous solutions, preferably with water alone.

According to the present invention, a copying composition is provided which contains a condensation product of an aromatic diazonium compound in admixture with a hydrophilic hardenable binder. The condensation product contains at least one unit each of the general types $A(-D)_n$ and B, which are connected by bivalent intermediate members derived from a condensable carbonyl compound, wherein A is a radical of a compound containing at least two isocyclic or heterocyclic aromatic nuclei, which compound is capable of condensation in at least one position with an active carbonyl compound in an acid medium, D is a diazonium salt group attached to an aromatic carbon atom of A, $n$ is is an integer from 1 to 10, and B is a radical of a compound free of diazonium groups, which compound is capable of condensation in at least one position with an active carbonyl compound in an acid medium, and wherein the anion of the diazonium salt is derived from an aliphatic monosulfonic acid having 1 to 6 carbon atoms.

As compared with known compositions of similar type used for the same purpose, the copying compositions according to the invention are distinguished by a substantially higher light-sensitivity and much better storability. The higher light-sensitivity is a quality which is more or less common to all the diazo mixed condensates described in the above mentioned earlier patent applications, irrespective of thier anions, whereas the storability and water-solubility of the compounds are substantially determined by their anions.

In order to ensure their water-developability, mainly water-soluble diazonium salts, such as the halides and sulfates, but preferably the chlorides, were hitherto used in known screen printing layers. However, it developed that the copying compositions and screen printing layers prepared with these diazonium salts possessed only a relatively low storability. Therefore, it has been the custom, in practice, to store the light-sensitive substances, i.e. the so-called "sensitizers", separately from the remainder of the liquid copying composition (the so-called "screen printing emulsion"), and to combine them to the so-called "screen printing composition" only immediately before use, i.e. before coating a screen printing support. Diazonium salts having better storage qualities in light-sensitive layers were known, but their water-solubility was invariably insufficient for aqueous development. Based on this experience, it was even assumed that the water-solubility and storability of diazonium salts were properties which were contrary to each other.

Therefore, it was particularly surprising that the diazonium salts of relatively low molecular weight aliphatic sulfonic acids used according to the invention possess a considerably better storability than do the hitherto used water-soluble salts, both in solid form and in aqueous solution or when contained in the light-sensitive layer, although the water-solubility of the preferred compounds within this group exceeds that of the corresponding chlorides.

The diazonium salts according to the invention have the further advantage over the hitherto used homocondensates that they can be easily separated in solid form from the condensation mixtures obtained during their preparation.

The copying compositions according to the invention can be stored for months, either in liquid form, as ready-made screen printing compositions, or in the form of presensitized screen printing materials.

The aliphatic monosulfonic acids forming the anions of the diazonium condensates used according to the invention normally have from 1 to 6 carbon atoms. They may further contain substituents that are not too heavy, for example halogen atoms, such as fluorine, chlorine, bromine or iodine, or hydroxyl groups, ether groups, and the like. Normally, they contain only one substituent. The aliphatic chain may be straight, branched, or annular. It also may contain double bonds, if desired.

Examples of suitable sulfonic acids are: methane sulfonic acid, ethane sulfonic acid, propane-2-sulfonic acid, propane-1-sulfonic acid, butane-1-sulfonic acid, 3-methyl-butane-1-sulfonic acid, cyclohexane-sulfonic acid, hexane-1-sulfonic acid, vinyl sulfonic acid, propene-1-sulfonic acid, 2-hydroxy-ethane-1-sulfonic acid, 3-hydroxy-propane-1-sulfonic acid, 3-methoxypropane-1-sulfonic acid, 2-chloro-ethane-sulfonic acid, 2-bromo-ethane sulfonic acid, chloromethane sulfonic acid, and the like.

It is also possible to use salts of two or more such acids in admixture with each other.

As a rule, the salts of sulfonic acids having more than four carbon atoms are less advantageous because their water-solubility is already limited. Of course, in this connection the chemical nature and the molecular weight of the condensation product also must be considered, which likewise influence the water-solubility of the compounds. Thus, relatively low molecular weight condensates containing hydrophilic groups may possess a satisfactory water-solubility even when used in the form of the hexane sulfonates. Generally, however, the lower sulfonates, and of these the methane sulfonates, are preferred. The last mentioned compounds have the best water-solubility, in combination with good storage qualities.

A further advantage of the methane sulfonates over the higher sulfonates is their lower price. Further, they can be prepared particularly easily, because methane sulfonic acid is a condensation medium which is suitable for the preparation of the mixed condensates. When this acid is used, the condensate is immediately obtained in the form of the methane sulfonate.

It is also possible, however, to prepare the mixed condensates by using other acids as condensation media, e.g. phosphoric acid, and the condensates thus obtained may even contain small amounts of the condensation medium without adverse effect. In particularly favorable cases, this may even increase the storability of the compounds prepared. Further, the diazonium salt used according to the invention may contain an excess of precipitating agent, e.g. sodium methane sulfonate, without detracting from its effectiveness, apart from the fact that it is diluted.

The preparation of the diazo polycondensates to be used according to the invention is described in detail in copending applications Ser. Nos. 826,297 and 826,296.

The condensation products may be prepared by condensing, in a strongly acid medium, at least one aromatic diazonium compound of the general formula $A(-D)_n$ and at least one compound of type B (the symbols having the meanings given above) with at least one active carbonyl compound, preferably formaldehyde, either in the free form or in the form of an agent yielding such carbonyl compound.

According to another method for the preparation of the diazo mixed condensates of the general type stated above, the use of an active carbonyl compound as such as dispensed with for mixed condensation and, instead of the component B, a modified second component $B_1$ of the general formula

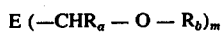
$$E(-CHR_a - O - R_b)_m$$

is used wherein

E is a residue obtained by the splitting-off of $m$ H- atoms from a compound B of the above described meaning, $R_a$ is H, or an aryl, alkyl, or heterocyclic group, preferably hydrogen, $R_b$ is H, or an alkyl or acyl group with 1 to 4 carbon atoms, or a phenyl group, and is preferably hydrogen, methyl, ethyl, or acetyl, and $m$ is an integer from 1 to about 10.

Condensation is performed in the presence of a strongly acid condensation medium. Preferably employed are concentrated moderately strong to strong acids.

Particularly advantageous condensation media are phosphoric acid, methane sulfonic acid, and sulfuric acid, which acids are employed in concentrations of at least 40%, preferably 70 to 100% by weight. The remainder generally is water, but also may entirely or partially consist of solvents, e.g. methanol, acetic acid, N-methyl pyrrolidone, and the like. Good results are obtained when using, e.g., 80 to 100% phosphoric acid, or 80% sulfuric acid, or 90% methane sulfonic acid.

85% phosphoric acid is a rather mild condensation medium in which the condensation can be performed very gently. It is, therefore, the most preferred condensation medium, particularly when the second of the above mentioned processes is employed, for all combinations of compounds which will react sufficiently rapidly under these rather gentle conditions. 90% methane sulfonic acid is a stronger medium. This acid has the further great advantage that is is capable of dissolving a plurality of components B and $B_1$.

The mean molecular weights of the condensation products may vary within wide limits, depending upon the selection of the condensation partners and conditions. It has been found that, for the production of good reproduction materials, mixed condensates having molecular weights between about 500 and 10,000 are generally preferred. It should be considered, however, that these values are mean values.

Groups effecting the condensability of the components $A(-D)_n$ and B are the following 1. Aryl radicals and heterocyclic radicals which have nuclear positions capable of condensation. Preferred are radicals in which these nuclear positions are activated. This activation may be effected, for example, by fusion with additional aromatic rings or by substitution by groups such as —OH, —O-alkyl, —O-aryl, —SH, —S-alkyl, —S-aryl, -alkyl, -aryl, -amino, -alkylamino, -dialkylamino, -arylamino, -diarylamino, and the like. In addition to these activating substituents, the condensable aromatic or heterocyclic radicals also may contain condensation-inhibiting groups, e.g. nitro or sulfonic acid groups, if the activation caused by other groups is only reduced but not eliminated.

2. Radicals which themselves are capable of condensation and may be directly linked to iso- or heterocyclic radicals or to aliphatic radicals, or, if desired, may be directly linked to one another. Such radicals are groups such as carboxylic acid amide, sulfonic acid amide, N-alkylsulfonic acid amide, N-arylsulfonic acid amide, nitrile, urea, thiourea, urethane, ureido, thioureido, glyoxaldiureine, imidazolone, guanidine, dicyanodiamide, and amino groups directly attached to aromatic rings.

An important group of diazonium compounds particularly for processing into condensation products in accordance with the present invention has a structure according to the following general formula

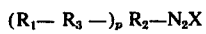
$$(R_1 - R_3 -)_p R_2 - N_2X$$

wherein:

$p$ is a positive whole number from 1 to about 3, preferably 1.

X is the anion of the diazonium salt.

$R_1$ is an aromatic iso- or aromatic heterocyclic group, if desired substituted, which has at least one position capable of condensation, and preferably is a phenyl group, if desired substituted. Preferable substituents are those which increase the reactivity of the nucleus with respect to condensation, e.g. alkyl and alkoxy groups.

$R_2$ is an aromatic ring of the benzene or naphthalene series, preferably a benzene ring, which, in addition to the diazo group, may carry other substituents.

$R_3$ is a connecting member between the rings $R_1$ and $R_2$, e.g. of the following types, of which the radical $R_1$ is always to be considered on the left-hand side, and the group $R_2$ on the right-hand side, if $R_3$ is not symmetrical:

Simple homopolar bond,
—$(CH_2)_q$—$NR_4$— ($q$ is a number from 0 to 5, $R_4$ is H or alkyl with 1 to 5 carbon atoms, or aralkyl with 7 to 12 carbon atoms, or aryl with 6 to 12 carbon atoms),
—$(CH_2)_q$—$NR_4$—$(CH_2)_r$—$NR_5$— ($r$ is a number from 2 to 5, $R_5$ is H or alkyl with 1 to 5 carbon atoms),
—O—$(CH_2)_r$—$NR_4$—
—S—$(CH_2)_r$—$NR_4$—
—O—$R_6$—O— ($R_6$ is arylene with 6 to 12 carbon atoms)
—O—
—S—
—CO—$NR_4$—
—$SO_2$—$NR_4$—.

Preferably, $R_3$ is a homopolar bond or one of the members
—O—
—S—
—NH—

2,3',5-trimethoxy-diphenyl-4-diazonium chloride
2,4',5-triethoxy-diphenyl-4-diazonium chloride
4-[3-(3-methoxy-phenyl)-propylamino]-benzene diazonium sulfate
4-[N-ethyl-N-(4-methoxy-benzyl)-amino]-benzene diazonium chloride
4-[N-(naphthyl-(2)-methyl)-N-n-propyl-amino]-benzene diazonium sulfate
4-[N-(3-phenoxy-propyl)-N-methyl-amino]-2,5-dimethoxy-benzene diazonium tetrafluoroborate
4-[N-(3-phenylmercapto-propyl)-N-ethyl-amino]-2-chloro-5-methoxy-benzene diazonium chloride
4-[4-(3-methyl-phenoxy)-phenoxy]-2,5-dimethoxy-benzene diazonium chloride
4-(4-methoxy-phenylmercapto)-2,5-diethoxy-benzene diazonium chloride
2,5-diethoxy-4-phenoxy-benzene diazonium chloride
4-(3,5-dimethoxy-benzoylamino)-2,5-diethoxy-benzene diazonium hexafluorophosphate
carbazole-3-diazonium chloride
3-methoxy-diphenyleneoxide-2-diazonium chloride
diphenylamine-4-diazonium sulfate.

A particularly important group of diazo compounds having structures according to the general formula $R_1 — R_3 — R_2 — N_2X$, and which are preferably used in accordance with the present invention for the preparation of the diazo condensation products are the salts of the diphenylamine-4-diazonium ion and its substitution products.

Preferably employed are the diphenylamine-4-diazonium salts derived from 3-alkoxy-4-amino-diphenyl amines having 1 to 3 carbon atoms in the alkoxy group, particularly from 3-methoxy-4-amino-diphenylamine.

The compounds to be used as components B or components $B_1$ derived therefrom may belong to the following groups of substances, for example:
aromatic hydrocarbons,
aromatic amines,
phenols and thiophenols,
phenol ethers and thiophenol ethers,
aromatic heterocyclic compounds,
urea, thiourea and carboxylic acid amides (aliphatic and aromatic),
sulfonic acid amides (aliphatic and aromatic).

Compounds B and/or $B_1$ having molecular weights of less than 500, preferably less than 250, are preferred. Particularly preferred compounds are the phenol ethers, thiophenol ethers, aromatic hydrocarbons, and non-basic heterocyclic compounds. Among these groups of substances, those are used with particular advantage which are derived from diphenyl ether, diphenyl sulfide, diphenyl methane, and diphenyl, and may carry one or two substituents for example halogen atoms, alkyl groups, or alkoxy groups, but which are preferably unsubstituted.

A group of diazo polycondensates which is particularly suitable for use according to the present invention are the condensation products of 3-alkoxy-diphenylamine-4-diazonium salts, and particularly 3-methoxy-diphenylamine-4-diazonium salts, and the above mentioned second components, particularly those which were prepared from $A(-D)_n$ and $B_1$ under gentle conditions, viz. in 80 to 100% orthophosphoric acid at a temperature in the range of +10 to about +40° C. Such condensates have a good light-sensitivity in combination with a good storability. Particularly useful condensation products of this group are the condensates of 3-methoxy-diphenylamino-4-diazonium salt and components $B_1$ of the following group:
4,4'-bis-methoxymethyl-diphenylether,
4,4'-bis-methoxymethyl-diphenylsulfide,
4,4'-bis-methoxymethyl-diphenylmethane, and
4,4'-bis-methoxymethyl-diphenyl.

According to the present invention, mixed condensates are preferred which contain 0.1 to 5, preferably 0.5 to 2, and most advantageously about 1 mole of component B or $B_1$ per mole of $A(-D)_n$ in polycondensed form.

For the preparation of the salts of organic sulfonic acids to be used according to the invention, normally the acid which is to form the anion is added to concentrated solutions of a soluble salt of one of the diazo mixed condensates, the acid being added either in free form or in the form of a soluble salt, using either a solid substance or a solution. The medium in which the compound is to be prepared should be such that it either dissolves as little as possible of the desired salt of an aliphatic monosulfonic acid, or that salting-out is possible by adding an excess of the sulfonic acid or of its salt.

Advantageously, aqueous solutions are used, i.e. the crude condensation mixture which may be obtained when preparing the condensation product is dissolved in water and the sulfonic acid or an alkali salt thereof is added, either as the substance itself or in the form of a concentrated aqueous solution. Depending upon the reactants selected, the desired salt separates either in the form of a solid precipitate which may be drawn off by suction, or in the form of a viscous mass which may be separated from the mother liquor by decanting.

Alternatively, it is possible to use aliphatic sulfonic acids as condensation media for the preparation of such condensates, and to separate the desired product by adding to the condensation mixture a non-solvent for the condensation product which dissolves the condensation medium, however.

It is of advantage for the diazonium salt of an aliphatic monosulfonic acid to be used according to the invention to contain a small amount of acid, preferably $H_3PO_4$, $H_2SO_4$, or methane sulfonic acid, because the storability of the product is enhanced by such acid content.

It is particularly simple when this quantity of acid is derived from the condensation medium which has not been completely separated. Alternatively, it may be added later to the pure substance. Normally, the quantity of acid should be no more than 2 moles, preferably not more than 0.5 mole, of acid per equivalent of diazonium groups.

For the preparation of the copying compositions according to the invention, various hydrophilic binders may be used in combination with the diazo compounds described. Polyvinyl alcohol, partially acylated polyvinyl alcohol, partially hydrolized polyvinyl acetate, polyacrylic acid, methyl cellulose, hydroxymethyl cellulose and gelatin are very suitable. Synthetic colloids, for example polyvinyl alcohol, partially saponified polyvinyl esters, and polyvinyl acetate dispersions that have been internally softened by copolymerization, e.g. with maleinates, have proved to be particularly advantageous.

Further, fillers may be added to the copying compositions in a finely divided, dispersed form, for example, in grain sizes between 5 and 30 $\mu$, preferably 10 to 20 $\mu$. Suitable fillers are, for example, synthetic substances, such as polyamides, polyesters, polyurethanes, and vinyl polymers, e.g. polyvinyl acetate, polystyrene, polyvinyl chlorides, and polyvinylidene chlorides. Preferably, they are used in the form of dispersions. Further, fine-grained silicon dioxide, aluminum oxide, titanium dioxide, silica, clay, powdered glass, metal complex dyes, and pigments may be used as fillers. Further, plasticizers, wetting agents, starch, salts and preserving agents may be added.

Water is preferably used as the solvent for the liquid copying composition. A minor proportion of the solvent, however, may be replaced by water-miscible organic solvents, for example lower alcohols, preferably methanol.

The copying composition according to the invention may be colored, either by pigments or by adding dissolved dyes. In some cases, it is advisable to color the uncolored copying composition only after it has been exposed and developed on the support, normally a screen printing fabric. This may be achieved by immersion in or wetting with a dyestuff solution, followed by rinsing to remove excess dyestuff that has not been absorbed. By another method, a dyestuff may be formed in the cross-linked layer by immersing the developed material in or moistening it with an alkaline solution of a coupling component, because even after the layer has sufficiently cross-linked, it still contains undecomposed diazo groups which are capable of coupling.

If the light-sensitive copying compositions according to the invention are used in the form of solid copying layers on a screen printing support, the materials normally used for screen printing may be used as supports. The flat and circular screens used for screen printing and textile printing are most suitable. They may consist of fabrics, fiber fleeces, or perforated films of synthetic material, e.g. polyamide or polyester, or of silk tissue or Japan paper, of metal wire gauzes consisting of steel, brass or bronze, or of galvanically produced rotary stencils, preferably nickel stencils.

The light-sensitive compounds to be used in the copying compositions of the invention also permit the addition of relatively large quantities of water-insoluble resins and other substances, the ease and speed of the aqueous developing process not being adversely affected by such addition.

When the copying composition according to the invention is used in the form of a presensitized material for screen printing, it possesses the good qualities of the well-known dichromate-colloid layers without having their disadvantages. The diazo compounds used in such materials are not only distinguished by their good water-solubility and storability, but they also have the advantage of being in the form of powdered solids, in contradistinction to the hitherto used liquid or oily diazo condensates. For easier handling, the compounds of the invention may be mixed with other powdered, water-soluble substances, e.g. polyvinyl alcohol.

Above all, the novel copying compositions and the copying materials prepared therefrom are distinguished from the diazo materials hitherto used for the same purpose in that they are markedly more light-sensitive and achieve the light-sensitivity of comparable dichromate layers. However, they do not have the disadvantages of dichromate-sensitized copying compositions, of which the best known are the poor storability of the coated material caused by thermal hardening in the dark, the limited shelf-life of the sensitized solutions, the lack of consistency in the copying characteristics, and the toxicity of the dichromates used.

Further, the dichromate-sensitized layers have the drawback that it is very difficult, and often impossible, to decoat the hardened layers. However, the possibility to decoat the material is often required for economic reasons. The layers according to the invention, however, are distinguished in that they are substantially more easily decoatable than are dichromate layers, even after an additional hardening process, e.g. thermal curing, in spite of the fact that their photocrosslinking characteristics are excellent and are fully sufficient, for example, for the requirements of printing. Even when used on rotary nickel stencils for which dichromate layers must be additionally hardened according to published German Patent Specification (DOS) No. 1,522,526, the copying compositions according to the invention not only withstand high printing stresses without further after-polymerization, but also can be decoated with formic acid by the method described on page 75 of the special issue of the BAYER FARBEN REVUE (No. 10) entitled: "Filmdruckschablonen" (Screen Printing Stencils).

The combination of components contained in the reproduction layers produced from the copying compositions of the invention may vary within wide limits. By the addition of hardenable resins and binders, the proportion of light-sensitive substance within the layer may be reduced and its light-sensitivity thereby increased. For the preparation of screen printing layers, the proportion of diazo condensate normally should not fall below 2%; when the proportion is 5%, the exposed layer already is completely insoluble in water, so that it is not necessary, in most cases, to use concentrations substantially above 5%. Of course, in special cases, for example in the case of diazo condensates having a high proportion of second component B or $B_1$, or in the case of less easily cross-linkable binders, it is also possible to employ considerably larger quantities of diazo condensate. Normally, however, the proportion of diazo condensate does not exceed 50%, and preferably is below 20%.

In the case of layers used for screen printing with solvent-soluble dyestuffs, such as, for example, commercially available screen printing inks suitable for printing on polyvinyl chloride surfaces the layer may consist only of the diazo condensate and a colloid. It is, however, of advantage for the mechanical properties of the layer to add water-insoluble fillers.

If the screen printing layer is to be used for preponderantly aqueous dyes, for example for textile printing, it is advisable to add substances which do not swell in water, in order to avoid or suppress a gradual swelling. Most advantageously, polyvinyl acetates are used for this purpose, in particular in the form of aqueous dispersions. Generally, the proportion of polyvinyl acetate should not exceed 60 to 70 per cent of the total quantity of solids present, in order to retain the aqueous developability of the layers.

The developers used are practically always aqueous liquids, pure water, without any additives, beng preferred.

By the following examples the invention will be illustrated, but it is not intended to limit its scope by these examples. If not otherwise stated, percentages are by weight.

EXAMPLE 1

12.9 g of 4,4'-bis-methoxymethyl-diphenylether were added dropwise, while stirring, to a solution of 32.3 g of 3-methoxy-diphenylamine-4-diazonium sulfate in 70.7 ml of 86% phosphoric acid. After condensing the mixture for 20 hours at 40° C., it was dissolved in 330 ml of water, and then 240 ml of a chloride-free aqueous solution of sodium methane sulfonate containing 144 g of the salt was added to the mixture. After decanting the mother liquor, the precipitate was once again dissolved in water and reprecipitated in the same manner, separated, dried under reduced pressure over phosphorus pentoxide, and comminuted to form a powder.

Yield: 37 g (C 48.0%, N 6.8%, S 10.7%, P 0.29%).

3 g of the substance thus produced were partially dissolved in 10 ml of water and then mixed, while stirring, with 100 g of an approximately 30% aqueous solution of polyvinyl alcohol having a K-value of 70 and a content of residual acetyl groups of about 12% ("Mowiol N 70–88", a product of Farbwerke Hoechst A.G., Frankfurt-Hoechst, Germany). The resulting mixture was then thoroughly mixed with 5 ml of dibutyl phthalate and 10 g of finely distributed silicic acid, and colored by the addition of 0.2 g of Crystal Violet. Both surfaces of a "Perlon" fabric were provided with double coatings of the screen printing composition thus produced, then dried, further dried for 5 minutes at 100° C., and then exposed for 2 minutes under a positive original, using a 5,000 watt xenon lamp at a distance of 65 cm. The stencil was then developed by means of a jet of cold water, the layer in the unexposed areas being washed out of the meshes and sharp contours being formed. After drying, the stencil thus produced could be used for printing paper or plastic materials, employing commercially available solvent-containing screen printing inks.

The screen printing composition described above and fabrics coated with it may be stored for at least 10 weeks at room temperature without losing any of its light-sensitivity.

EXAMPLE 2

33.3 g of finely pulverized 1,3-bis-hydroxymethyl-4,6-diisopropyl-benzene were added, in portions, while stirring, to a solution of 32.3 g of 3-methoxy-diphenylamine-4-diazonium sulfate in 210 ml of 86% phosphoric acid. After condensing it for 12½ hours at 40° C. and allowing it to stand for 4½ hours at room temperature, the mixture was dissolved in 550 ml of water heated to 60° C., and the methane sulfonate of the condensation product was separated by adding 800 ml of an aqueous solution containing 240 g of sodium methane sulfonate while cooling to room temperature. For purification, the product was dissolved again in water and reprecipitated in the same manner, then finally separated and dried.

Yield: 50 g.

An aqueous solution containing 2 g of the diazo compound thus prepared was mixed with 100 g of a screen printing emulsion consisting of equal parts by weight of a 25% solution of polyvinyl alcohol with a K-value of 75 and a content of residual acetyl groups of about 12% ("Mowiol N 75–88", a product of Farbwerke Hoechst A.G., Frankfurt-Hoechst, Germany) and a dispersion of a vinyl acetate copolymer having a solids content of 55% ("Mowilith DM 2", a product of Farbwerke Hoechst A.G., Frankfurt-Hoechst, Germany). A polyester screen printing fabric was coated with this mixture in the normal manner, dried, exposed, developed with water, and dried. In order to improve the visibility of the image, the developed, but not yet dried stencil was dyed by pouring an aqueous solution of Crystal Violet over it. Excess dyestuff not absorbed by the layer in the image areas was removed by rinsing with water before drying the stencil. The screen printing stencil thus produced was excellently suited for printing on textiles, the conventional aqueous textile printing inks being used.

EXAMPLE 3

25.9 of 4,4'-bis-methoxymethyl diphenyl ether were added dropwise, while stirring, to a solution of 42.5 g of 2,5,4'-triethoxy-diphenyl-4-diazonium sulfate (N 6.2%) in 300 ml of 93% phosphoric acid. After condensing it for 3¼ hours at 40° C., the mixture was diluted with 300 ml of water and, by adding 860 ml of a 26% methane sulfonic acid solution, the methane sulfonate was precipitated, separated after reprecipitation, and finally dried.

Yield: 67.3 g (C 48.1%, N 3.0%, S 8.1%, P 3.8%).

An approximately 30% polyvinyl alcohol solution, prepared by stirring polyvinyl alcohol with a K-value of 50 and a content of residual acetyl groups of about 12% ("Mowiol N 50–88", a product of Farbwerke Hoechst A.G., Frankfurt-Hoechst, Germany) for about 8 hours with water at a temperature of about 85° C. in an open vessel and adding 1% of polyglycol P 1200 (a product of Dow Corning Corporation, of Frankfurt, Germany) as an anti-foaming agent, was mixed in a ratio of 3 : 1 with a 55% dispersion of a vinyl acetate maleinate copolymer ("Mowilith DM 1", a product of Farbwerke Hoechst A.G., Frankfurt-Hoechst, Germany). 250 g of this mixture were mixed with 4 g of the above described water-soluble diazo compound.

A screen was coated with the screen printing composition thus produced, dried, exposed, and developed, and the screen printing stencil thus obtained was used for printing on polyvinyl chloride film. The stencil was free from defects in the layer, i.e. so-called grease spots, and thus could be used for printing long runs without spotting. When the stencil is no longer needed, it is possible to clean the fabric by decoating it, for example with calcium hypochlorite or sodium hypochlorite, but preferably with a lithium hypochlorite solution, and then to use it again.

EXAMPLE 4

25.8 g of 4,4'-bis-methoxymethyl-diphenylether were added dropwise, while stirring, to a solution of 32.3 g of 3-methoxy-diphenylamine-4-diazonium sulfate in 100 ml of 86% phosphoric acid. After condensing the reaction mixture for 17 hours at 40° C., the methane sulfonate produced was separated as described in the preceding examples, purified, and dried.

Yield: 53 g. (C 55.3%, N 6.5%, S 6.2%, P 1.9%, Cl less than 0.1%, $H_2O$ 4.3%).

1,000 g of a screen printing emulsion consisting of 3 parts by weight of a 53% vinyl acetate copolymer dispersion ("Mowilith DM 2 HB" a product of Farbwerke Hoechst A.G., Frankfurt-Hoechst, Germany) and 2 parts by weight of a 24% solution of the polyvinyl alcohol used in Example 2, which had been prepared by dissolution and concentration, was mixed, while stirring, with an aqueous solution of 15 g of the diazo condensate described above and 4 g of "Imperon-Blue K-B" (a product of Farbwerke Hoechst A.G., Frankfurt-Hoechst, Germany). A perforated rotary nickel cylinder having 576 meshes per square centimeter (60 mesh) was coated three times with this composition by passing a curved rubber wiper filled with the composition upwardly over the surface of the upright perforated cylinder and drying after each coating. In this manner, the perforations of the cylinder were filled with the light-sensitive composition. After an all-round exposure by means of a tubular mercury lamp, during which the cylinder with the original fastened to it turned slowly, the layer in the unexposed areas was removed from the perforations by rinsing with water. The curved stencil, which was almost free from hairline cracks, was slightly retouched and then made ready for printing by further hardening it by a heat treatment at 150° to 180° C. The printing form thus produced could be used for printing long runs of textiles. The spent rotary nickel stencil may be decoated with ferric acid, so that the perforated cylinder can be used again.

EXAMPLE 5

The condensation mixture of Example 4 was condensed for 5 hours at 40° C. and the condensation product was separated in the form of the chloromethane sulfonic acid salt as described in said example.

250 g of a 30% solution of the polyvinyl alcohol used in Example 1 containing 5% of fine-grained polyvinyl acetate powder ("Mowilith 30", a product of Farbwerke Hoechst A.G., Frankfurt-Hoechst, Germany) were sensitized by adding an aqueous solution containing 4 g of the above substance.

A screen printing stencil was prepared in the normal manner by coating a screen with this mixture and then drying, exposing, developing, and again drying it.

EXAMPLE 6

A diazo condensate was prepared analogously to the method described in Example 5, but was separated in the form of the propane-2-sulfonic acid salt.

A 10% aqueous solution of hydroxyethyl cellulose ("Tylose HEC H 20p", a product of Kalle Aktiengesellschaft, Wiesbaden-Biebrich, Germany) was mixed with 1% of the light-sensitive compound described above. By coating both surfaces of a fine-meshed screen printing fabric three times with this mixture, followed by exposure, development with water, and drying, a stencil was prepared which was very well suited for screen printing with solvent dyes.

Similar results were obtained when the diazo condensate was separated in the form of the butane-1-sulfonic acid salt and then further processed in the same manner.

It will be obvious to those skilled in the art that many modifications may be made within the scope of the present invention without departing from the spirit therof, and the invention includes all such modifications.

What is claimed is:

1. A process for the preparation of screen printing stencils, which comprises coating a screen printing support with a liquid light-sensitive composition comprising a hydrophilic hardenable binder in admixture with a condensation product comprising repeating units of each of the general types $A-N_2X$ and B which are linked by methylene groups, in which A is a radical of a compound of one of the general formulae $(R_1-R_3-)_pR_2-N_2X$ and

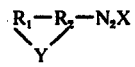

wherein
$R_1$ is an arylene group of the benzene or naphthalene series
$R_2$ is a phenylene group
$R_3$ is a single bond or one of the groups $-(CH_2)_q-NR_4-$ $-O-(CH_2)_r-NR_4-$ $-S-(CH_2)_r-NR_4-$ $-S-CH_2-CO-NR_4-$ $-O-R_5-O-$ $-O-$ $-S-$ or $-CO-NR_4-$ the left-hand free valence of the specified groups is attached to $R_1$ and the right-hand free valence is attached to $R_2$
wherein
$q$ is a number from 0 to 5
$r$ is a number from 2 to 5

$R_4$ is selected from the group consisting of hydrogen, alkyl with 1 to 5 carbon atoms, aralkyl with 7 to 12 carbon atoms, and aryl with 6 to 12 carbon atoms,
$R_5$ is an arylene group having 6 to 12 carbon atoms
—Y— is one of the groups —NH—, and —O—

X is the anion of an aliphatic monosulfonic acid having 1 to 6 carbon atoms, and
p is a number from 1 to 3, and
B is a radical of a compound free of diazonium groups selected from the group consisting of aromatic amines, phenols, thiophenols, phenol ethers, aromatic thioethers, aromatic heterocyclic compounds, aromatic hydrocarbons and organic acid amides,
which condensation product contains, on the average, about 0.01 to 50 B units per unit of A—$N_2$X,
drying the light sensitive layer thus prepared,
exposing the dried layer to light under a master, and removing the unexposed portions of the layer by treatment with an aqueous liquid.

2. A process according to claim 1 in which the condensation product used is in the form of the salt of an aliphatic monosulfonic acid having 1 to 4 carbon atoms.

3. A process according to claim 2 in which the condensation product is in the form of a methane sulfonate.

4. A process according to claim 1 in which the condensation product is a condensate of a 3-alkoxy-diphenylamine-4-diazonium salt and a diphenylether, diphenylsulfide, diphenylmethane or diphenyl compound.

5. A process according to claim 1 in which the condensation product contains the units A—$N_2$X and B in a molar ratio between 1 : 0.5 and 1 : 2.

6. A process according to claim 1 in which the coating composition contains the condensation product in a proportion of 2 to 20% by weight of the solids content.

7. A process according to claim 1 in which the coating composition is in the form of an aqueous solution.

8. A process according to claim 7 in which the solution contains, in addition, a dispersed filler.

9. A process according to claim 8 in which the dispersed filler is a water-insoluble organic polymer.

10. A process according to claim 9 in which the water-insoluble organic polymer is a vinyl acetate polymer.

11. A process according to claim 1 in which the hydrophilic binder is polyvinyl alcohol.

12. A process according to claim 1 in which the condensation product is a condensate of 4,4'-bis-methoxymethyl-diphenylether and 3-methoxydiphenylamine-4-diazonium sulfate.

13. A process according to claim 1 in which the condensation product is a condensate of 1,3-bis-hydroxymethyl-4,6-diisopropylbenzene and 3-methoxy-diphenylamine-4-diazonium sulfate.

14. A process according to claim 1 in which the condensation product is a condensate of 4,4'-bis-methoxymethyl diphenyl ether and 2,5,4'-triethoxydiphenyl-4-diazonium sulfate.

15. A light-sensitive reproduction material including a screen printing support carrying a light-sensitive layer comprising a hydrophilic hardenable binder in admixture with a light-sensitive condensation product comprising repeating units of each of the general types A—$N_2$X and B which are linked by methylene groups, in which
A is a radical of a compound of one of the general formulae $(R_1-R_3-)_p\ R_2-N_2X$ and

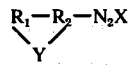

wherein
$R_1$ is an arylene group of the benzene or naphthalene series
$R_2$ is a phenylene group
$R_3$ is a single bond or one of the groups —$(CH_2)_q$—$NR_4$—

—O—$(CH_2)_r$—$NR_4$—

—S—$(CH_2)_r$—$NR_4$—

—O—$R_5$—O—

—O—

—S— or

—CO—$NR_4$— the left-hand free valence of the specified groups is attached to $R_1$ and the right hand free valence is attached to $R_2$
wherein
q is a number from 0 to 5
r is a number from 2 to 5
$R_4$ is selected from the group consisting of hydrogen, alkyl with 1 to 5 carbon atoms, aralkyl with 7 to 12 carbon atoms, and aryl with 6 to 12 carbon atoms,
$R_5$ is an arylene group having 6 to 12 carbon atoms
—Y— is one of the groups —NH—, and —O—

X is the anion of an aliphatic monosulfonic acid having 1 to 6 carbon atoms, and
p is a number from 1 to 3, and
B is a radical of a compound free of diazonium groups selected from the group consisting of aromatic amines, phenols, thiophenols, phenol ethers, aromatic thioethers, aromatic heterocyclic compounds, aromatic hydrocarbons and organic acid amides,
which condensation product contains, on the average, about 0.01 to 50 B units per unit of A—$N_2$X.

16. A light-sensitive reproduction material according to claim 15 in which the condensation product is in the form of the salt of an aliphatic monosulfonic acid having 1 to 4 carbon atoms.

17. A light-sensitive reproduction material according to claim 16 in which the condensation product is in the form of a methane sulfonate.

18. A light-sensitive reproduction material according to claim 15 in which the condensation product is a condensate of a 3-alkoxy-diphenylamine-4-diazonium salt and a diphenylether, diphenylsulfide, diphenylmethane or diphenyl compound.

19. A light-sensitive reproduction material according to claim 16 in which the condensation product contains the units A—N₂X and B in a molar ratio between 1 : 0.5 and 1 : 2.

20. A light-sensitive reproduction material according to claim 15 containing the condensation product in a proportion of 2 to 20% by weight of the solids content.

21. A light-sensitive reproduction material according to claim 15 including a dispersed filler.

22. A light-sensitive reproduction material according to claim 21 in which the dispersed filler is a water-insoluble organic polymer.

23. A light-sensitive reproduction material according to claim 22 in which the water-insoluble organic polymer is a vinyl acetate polymer.

24. A light-sensitive reproduction material according to claim 15 in which the hydrophilic binder is polyvinyl alcohol.

25. A light-sensitive reproduction material according to claim 15 in which the condensation product is a condensate of 4,4'-bis-methoxymethyl-diphenylether and 3-methoxy-diphenylamine-4-diazonium sulfate.

26. A light-sensitive reproduction material according to claim 15 in which the condensation product is a condensate of 1,3-bis-hydroxymethyl-4,5-diisopropyl-benzene and 3-methoxy-diphenylamine-4-diazonium sulfate.

27. A light-sensitive reproduction material according to claim 15 in which the condensation product is a condensate of 4,4'-bis-methoxymethyl diphenyl ether and 2,5,4'-triethoxy-diphenyl-4-diazonium sulfate.

* * * * *